United States Patent [19]

Sue et al.

[11] Patent Number: 5,185,211

[45] Date of Patent: Feb. 9, 1993

[54] NON-STOICHIOMETRIC TITANIUM NITRIDE COATING

[75] Inventors: Jiinjen A. Sue, Carmel; Harden H. Troue, Plainfield, both of Ind.

[73] Assignee: Praxair S.T. Technology, Inc., Danbury, Conn.

[21] Appl. No.: 728,339

[22] Filed: Jul. 11, 1991

[51] Int. Cl.$^5$ ..................... B22D 25/00; B32B 15/04
[52] U.S. Cl. ..................... 428/472; 428/336; 428/469; 428/621; 428/627; 428/628; 428/655; 428/660; 428/698; 428/704
[58] Field of Search ............... 428/698, 336, 472, 469, 428/704, 621, 627, 628, 655-660

[56] References Cited

U.S. PATENT DOCUMENTS

| | | | |
|---|---|---|---|
| 3,771,976 | 11/1973 | Wakefield | 428/698 |
| 3,900,592 | 8/1975 | Kennedy et al. | 428/212 |
| 3,988,955 | 11/1976 | Engel et al. | 428/472 |
| 4,226,082 | 10/1980 | Nishida | 428/927 |
| 4,411,960 | 10/1983 | Mizuhara | 428/698 |
| 4,693,944 | 9/1987 | Sugisawa et al. | 428/698 |
| 4,904,528 | 2/1990 | Gupta et al. | 428/336 |

FOREIGN PATENT DOCUMENTS

| | | |
|---|---|---|
| 58-64380 | 4/1983 | Japan . |
| 63-153260 | 6/1988 | Japan . |
| 2135337A | 8/1984 | United Kingdom . |

OTHER PUBLICATIONS

Buhl et al "TiN Coatings on Steel" Thin Solid Films 80 (1981) 265-270.

Munz et al "A High Rate Sputtering Process for the Formulation of Hard Friction-Reducing TiN Coatings on Tools" Thin Solid Films, 9.6 (1982) 79-86.

Zdanowsk et al "Modification of Metal Properties by Ion Plating of TiN" Vacuum, vo. 36, No. 10, pp. 591-594 (1986).

Surface and Coatings Technology, 36(1988) pp. 695-705 "Influence of Residual Compressive Stress on Erosion Behavior of Arc Evaporation Titanium Nitride Coating", J. A. Sue and H. H. Troue, presented at 5th International Conference on Metallurgical Coatings, San Diego, Calif.

Surface and Coatings Technology, 33(1987) pp. 169-181, "Effect of Crystallographic Orientation on Erosion Characteristics of Arc Evaporation Titanium Nitride coating", J. A. Sue and H. H. Troue, presented at 14th International Conference on Metallurgical Coatings, San Diego, Calif.

Thin Solid Films, 167(1988) pp. 107-119 "New Results in d.c. Reactive Magnetron Deposition if $TiN_x$ Films", J. Musil et al. presented at the 6th International Conference on Ion and Plasma Assisted Techniques, Brighton, Gt. Britain, May 27-29, 1987.

Thin Solid Films, 153(1987) pp. 19-36 "High Temperature Micro-Hardness of Hard Coatings Produced by Physical and Chemical Vapor Deposition", Dennis T. Quinto, et al presented at the 14th International Conference on Metallurgical Coatings, San Diego, Calif.

"Infludence of Crystallographic Origntation, Residual Strains, Crystallite Size and Microhardness on Erosion in ZrN Coating", J. A. Sue and H. H. Troue, presented at 16th International Conference on Metallurgical Coatings, San Diego, Calif.

Nuclear Instruments and Methods in Physics Research B37/38 (1989) pp. 897-901 "Effect of Ion Bombardment on the Structure of Sputtered Ti-N Films", J. Musil, et al, VII Emerging Processes for VII.

The Institute of Metals and the Wolfson Institute for Surface Engineering, "Plasma Processign in Nitrogen Containing Atmospheres: 10 Years' Development", A. S. Korhonen, et al pp. 44-50.

(List continued on next page.)

Primary Examiner—Alexander S. Thomas
Assistant Examiner—Archene A. Turner
Attorney, Agent, or Firm—Cornelius F. O'Brien

[57] ABSTRACT

A wear and erosion resistant coating for substrates having a non-nitrogen titanium-containing outer surface onto which a non-stoichiometric titanium nitride coating is deposited in which the nitrogen content in the titanium nitride coating is from 32.5 to 47 atomic weight percent.

11 Claims, 5 Drawing Sheets

OTHER PUBLICATIONS

The Institute of Metals and the Wolfson Institute for Surface Engineering, "Effects of Deposition Parameters on Structure and Composition of Reactively Sputtered $TiN_x$ Filsm", Dr. R. Manory Surface Engineering 1987 vo. 3, No. 3, pp. 233–238.

Proc. 7th ICVM, 1982, Tokyo, Japan, "Film Characteristics and Deposition Conditions in Reactive Ion Plating of Titanium Nitride" pp. 110–117.

Thin Solid Films, 156(1988) pp. 53–63, "Metallurgical and Protective Coatings", tructure of TiN Coatings Deposited at Relatively High Rates and Low Temperatures by Magnetron Sputtering V. Valvoda, et al pp. 53–63.

"X-Ray Diffraction Residual Stress Measurement", Lambda Research Incorporated, X-Ray Diffraction Laboratory.

NON-STOICHIOMETRIC TITANIUM NITRIDE COATING

FIELD OF THE INVENTION

The invention relates to a wear and erosion resistant coating for a substrate having a titanium-containing surface, said coating composed of a top layer of non-stoichiometric titanium nitride in which the nitrogen content of the coating is from 32.5 to 47 atomic weight percent.

BACKGROUND OF THE INVENTION

Resistance against erosion wear is normally related to the hardness of the wear part. Some articles are subject to solid particle erosion in which particles of various sizes and hardness are propelled at various angles against the surface of the articles. For example, a car traveling in the desert during a wind storm will encounter various size solid particles of sand traveling at various velocities hitting the car. If the size of the particles is large and the velocity of the particles is high, the coating on the car could be chipped or pitted. In turbomachines which operate in a dust environment, this solid particle erosion is a severe problem. Recently, physical and chemical vapor deposited coatings, such as titanium nitride coatings and zirconium nitride coatings, have been used to provide a protective layer having good hardness characteristics. These coatings have been found to have good erosion resistance to $Al_2O_3$ and $SiO_2$ particles at both high and low impact angles. Although these coatings have high hardness characteristics, they exhibit inherently brittle behavior and their erosion resistance at normal impact decreases markedly with increasing hardness and particle size of the erodent. It has been observed that dynamic impact of solid particle erodents onto a coated surface of an article can form lateral and/or median cracks around the impact site. Median cracks are responsible for the strength degradation of the material while lateral cracks, which grow from the center of impact parallel to the substrate surface and then propagate through the coating surface, account for most of the material loss during solid particle impact erosion. The solid particle impact erosion of these coatings at a 90° impact angle is due primarily to brittle fracture. Thin coatings are more susceptible to spalling and exposure of the substrate which may lead to premature failure of the article. When coatings applied by conventional techniques are exposed to particle impact, pinholes and/or lateral spalling pits generally result in the coating. Once the coating material is cracked, additional impact by even relatively small particles will cause furrowing or grooves in the coating material. In a turbomachine, this furrowing can greatly affect the overall performance of the turbomachine.

Based on the elastic-plastic theory, toughness and hardness are the dominant properties controlling the erosion behavior. Higher hardness is believed to increase erosion resistance at both low and high impingement angles while higher toughness reduces the vulnerability to brittle fracture and markedly increases 90° erosion resistance. An erosion resistant coating needs to be simultaneously hard and tough. However, hardness and toughness are generally in opposition in hard materials. Higher hardness is usually associated with greater brittleness. Multilayer hard compound materials have been found to have simultaneously high hardness and high toughness. The high hardness is an inherent property of hard compounds and the high toughness is attributed to the formation of a coherent or partly coherent interface boundary between two different hard compound layers. For example, it has been found that a $TiC/TiB_2$ multilayer coating has a better wear resistance than either the TiC or $TiB_2$ single layer. In cutting tool applications, the multilayer coated tool bits, having a $TiC/Al_2O_3/TiN$ three layer coating, or a two layer coating in which one layer is a nitride, carbide, boride, or silicide of a metal of Group VI of the Periodic Table and the other layer is a nitride or carbide of a metal of Group VI of the Periodic Table, have shown good performance in wear resistance.

In copending application U.S. Ser. No. 405,131 now abandoned, a multilayer coating is disclosed which has good wear and erosion resistant characteristics, such multilayer coating comprising alternate lamellas layers of a nitride-containing compound in which at least one layer contains at least 2 atomic percent of nitrogen different than the nitrogen contained in an adjacent layer.

It is an object of the present invention to provide a substrate having a titanium-containing surface with a top layer of a non-stoichiometric titanium nitride coating that has good wear resistance and/or erosion characteristics to solid particle impact.

Another object of the present invention is to provide a titanium coated substrate with a non-stoichiometric titanium nitride coating in which the atomic percent of nitrogen in the titanium nitride is between 32.5% and 47%.

The above and further objects and advantages of this invention will become apparent upon consideration of the following description.

SUMMARY OF THE INVENTION

The invention relates to a non-stoichiometric titanium nitride coating for substrates having a non-nitrogen titanium-containing outer surface in which the atomic percent of nitrogen in the titanium nitride coating is from 32.5% to 47%. Preferably, the atomic percent of nitrogen in the non-stoichiometric titanium nitride coating could be from 36% to 44% and most preferably about 40%. A coating containing a layer of titanium nitride in which the nitrogen is less than 32.5 atomic percent has been observed to be extremely difficult to strip by conventional means, while a nitrogen content of greater than 47 atomic percent has been observed to be susceptible to spalling by radial and lateral cracks due to direct impact of particles and has been found to have high residual compressive stress. The coating of this invention has good wear and corrosion characteristics and should have a crystallize size, measured in the direction perpendicular to (111) diffraction plane, of less than 55 nm, preferably less than 50 nm.

A method for producing a non-stoichiometric titanium nitride coating on a substrate having a titanium-containing surface could comprise the steps:

(a) placing a substrate having a titanium-containing outer surface in a chamber containing a titanium-based target and a nitrogen-containing gas mixture;

(b) evaporating the titanium from the titanium-based target to produce a titanium vapor to react with the nitrogen in the nitrogen-containing gas mixture and adjust the ratio of nitrogen to titanium to form a titanium nitride layer on the substrate that has a nitrogen content from 32.5 atomic percent to 47 atomic percent.

One preferred embodiment for producing a titanium nitride coating on a titanium coated substrate would comprise the steps:

(a) placing a titanium coated substrate having a titanium-containing outer surface in a vapor deposition chamber having an anode and containing a titanium-based cathode along with a nitrogen-containing gas mixture;

(b) applying a voltage across the cathode and anode to establish a current to effect evaporation of the titanium from the titanium-based cathode to produce a titanium vapor to react with the nitrogen in the nitrogen-containing gas mixture and;

(c) adjusting the ratio of nitrogen to titanium to form a titanium nitride layer on the substrate that has a nitrogen content from 32.5 atomic percent to 47 atomic percent.

It is believed that the simultaneous coating of a substrate with a $TiN_x$ based composition and bombardment of the titanium-containing outer surface of the substrate with inert gas ions, such as argon ions, will produce a low stress and small crystallite for the $TiN_x$ coating of this invention.

Preferably, the nitrogen-containing gas mixture could be argon-nitrogen; krypton-nitrogen; helium-nitrogen; xenon-nitrogen; neon-nitrogen or the like. The titanium nitride coating of this invention can be deposited by using conventional physical vapor deposition techniques such as arc processes, dc and rf magnetron sputtering, reactive ion plating and the like.

As used herein, a substrate having a titanium-containing outer surface is a titanium substrate or a substrate coated with titanium or with a non-nitrogen titanium alloy. If the substrate is other than titanium, the titanium-containing outer layer should preferably be from 0.1 to 6.0 microns thick, and more preferably from 0.2 to 4.0 microns thick.

The thickness of the titanium nitride coating of this invention can vary greatly as for example between 1 to 40 microns thick while for wear applications the preferred thickness of the coating could be between 1 to 15 microns and for erosion applications the coating could be 8 to 40 microns.

The titanium nitride coating of this invention is ideally suited for coating substrates such as titanium, titanium coated iron, titanium coated aluminum, titanium coated nickel, titanium coated cobalt, alloys of the base substrate material thereof and the like. In applications using other than a titanium substrate, the substrate should be coated with a non-nitrogen titanium-containing layer prior to depositing the coating of this invention since titanium will effectively provide a better adherence for the coating.

DRAWINGS

EXAMPLE 1

Figure 1:
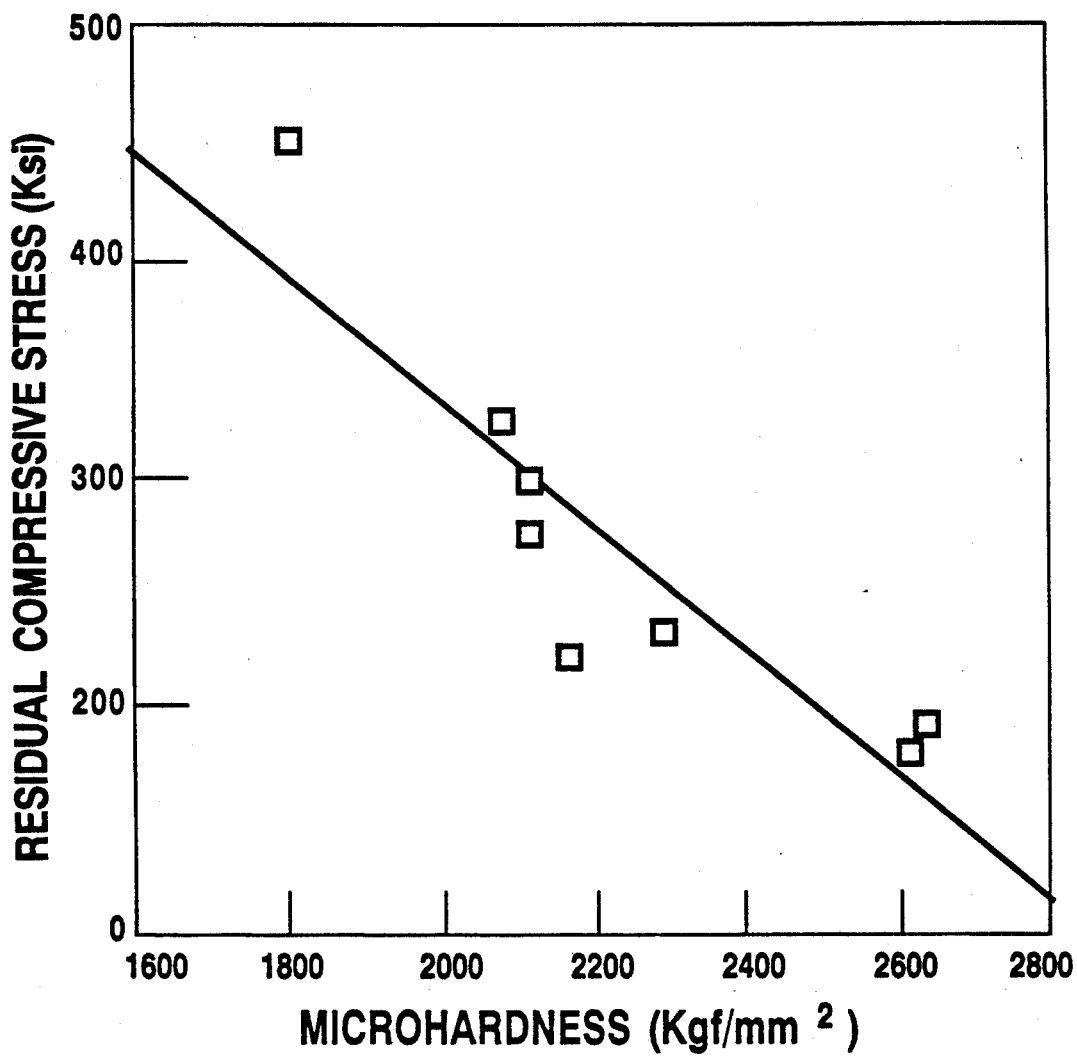
FIG. 1 is a plot of residual compressive stress vs. microhardness for the coating of this invention.

Titanium nitride coatings were deposited on Ti-6Al-4V substrates using a physical vapor deposition arc evaporation process. Before deposition, the vapor deposition chamber was evacuated to a pressure below $7 \times 10^{-4}$ Pa and then backfilled with argon to 0.7 Pa. The substrate to be coated was sputtered to remove surface contaminants. Subsequently, a 250 ampere d.c. arc was activated across a titanium ca and a chamber which acts as an anode to evaporate Ti from the Ti cathode in an argon environment at an overall pressure about 4 Pa so as to deposit about 1 micron of titanium on the substrate and then the argon was changed to an argon-nitrogen reactive gas mixture. The ionized Ti vapor reacted with $N_2$ ions and then formed a titanium nitride coating on the substrate. Each coating was formed by adjusting the nitrogen $N_2$ gas flow rates during the deposition. Specifically the nitrogen gas flow was varied from approximately 80 to 100 standard cubic centimeters per minute (sccm) and the total argon gas flow was maintained at about 250 sccm. The deposition temperature, determined using an optical pyrometer, was between 420° C. and 530° C.

The nitrogen content of each sample coating was measured by sputtered mass neutral spectrometry. The neutral atoms of the coating were sputtered from its surface into plasma by ions which were generated from a low pressure r.f. plasma. The neutral atoms were then ionized by energetic electron impact. These ions were subsequently analyzed and detected in a quadrupole mass spectrometer. The measured area was in an 8 mm diameter circle and the total sputtered depth was approximately 5 microns.

The nitrogen content of each sample coating is shown in the Table.

TABLE

COMPARISON OF MATERIAL AND STRUCTURAL PROPERTIES BETWEEN NON-STOICHIOMETRIC AND STOICHIOMETRIC TITANIUM NITRIDE COATINGS

| Coating | N Content (at. %) | Crystallite Size (nm) $D_{111}$ | Crystallite Size (nm) $D_{200}$ | Microhardness (Kgf mm$^{-2}$) | Residual Compressive Stress (Ksi) | Relative Erosion Resistance 90° | Relative Erosion Resistance 20° |
|---|---|---|---|---|---|---|---|
| I | 32.5 | 18.2 | 10.9 | 2286 ± 17 | 233 ± 17 | 5.3 | 0.92 |
| II | 38.6 | 27.8 | 16.0 | 2636 ± 53 | 195 ± 8 | 6.5 | 1.5 |
| III | 39.9 | 33.8 | 18.8 | 2611 ± 84 | 183 ± 8 | 7.3 | 1.6 |
| IV | 46.8 | 45.4 | 22.3 | 2168 ± 46 | 221 ± 17 | 4.0 | 0.91 |
| V | 47.0 | 50.3 | 33.0 | 2122 ± 45 | 278 ± 22 | 3.2 | 1.1 |
| VI | 48.0 | 45.4 | 27.4 | 2120 ± 51 | 302 ± 23 | 2.4 | 0.91 |
| VII | 49.3 | 73.8 | 33.0 | 2081 ± 60 | 323 ± 26 | 1.5 | 1.1 |
| VIII | 50.0 | 75.0 | 41.5 | 1800 ± 90 | 450 ± 15 | 1.0 | 1.0 |

The crystallite size of each of the sample coatings was determined by the Scherrer formula as follows:

$$D_{hkl} = \frac{K\lambda}{\beta \cos\theta}$$

Where $D_{hkl}$ is the dimension of crystallite in the direction perpendicular to the reflecting plan (hkl), K is the crystallite shape factor which is assumed to be 1 in this case, $\lambda$ is the wavelength of the X-rays, $\theta$ is the glancing angle of incidence, and $\beta$ is the half-maximum breadth. Typically, the experimentally observed breadth ($\beta$) is comprised of B due to the particle size effect and b resulting from the instrumental broadening, $\beta = B + b$. The instrumental broadening, b, was determined using TiN powder with particle size greater than several microns. The crystallite size $D_{111}$ and $D_{200}$ were determined and the results are shown in the Table. This data shows that the crystallite size $D_{111}$ and $D_{200}$ increased with increasing nitrogen content. A large increase in crystallite size of both $D_{111}$ and $D_{200}$ occurred at approximately 47 atomic percent of nitrogen. Although not bound by theory, it is believed that the small crystallite size in the coatings with nitrogen content less than 47 atomic percent was probably caused by a continuous formation of nucleation sites resulting from argon ion bombardment during deposition in which the reactants such as Ti and N ions were sufficient to rapidly renucleate new grains at newly formed nucleation sites.

Residual stresses of the sample $TiN_x$ coatings were determined using the standard $\sin^2\psi$ method based on the change in lattice spacings (strain).

The stresses of $TiN_x$ sample coatings were then measured with the assumption of Young's modulus of $40.6 \times 10^6$ psi and a poisson ratio of 0.25.

Residual compressive stress was found in all the $TiN_x$ sample coatings and the data are shown in the Table. The magnitude of compressive stress decreased with decreasing N content and reached a minimum at about 39 atomic percent of nitrogen.

The as-coated surface of each of the $TiN_x$ sample coatings was metallographically polished before being subjected to microhardness measurements, using a Vickers hardness tester with a load of 0.1 Kg for 15 seconds. The data obtained is presented in the Table and shows that the microhardness of $TiN_x$ increased with increasing nitrogen content from 2290 kilogram force per square millimeter ($Kgfmm^{-2}$) at 32.5 atomic percent N to a maximum of 2640 $kgfmm^{-2}$ at 38.6 atomic percent N, and then decreased to 1800 $Kgfmm^{-2}$ at 50 atomic percent N. Based on the data in the Table, the $TiN_x$ coatings with a maximum microhardness exhibited a minimum residual compressive stress. This discovery is in contrast to what has been observed in the art in which the hardness of a coating increases with increasing residual compressive stress. In general, the microhardness of the coating increases with decreasing crystallite size and it is also believed that small crystallite size contributed to high microhardness of the coating. However, relatively high Ti content in the coating with 32.5 atomic percent of nitrogen, showed an adverse effect on microhardness in spite of small crystallites.

The $TiN_x$ sample coatings were exposed to 50 microns alumina erosion at both 20° and 90° impingement angles at room temperature. Compressed air with a pressure of 290 Kpa (42 psig) was used to deliver alumina particles through a 5 mm diameter alumina nozzle. The nozzle-to-specimen distance was maintained at 10 cm. The amount of alumina particles used for 20° and 90° erosion was 1600 g and 400 g, respectively. The relative erosion resistance was calculated by comparing the total weight loss of the non-stoichiometric $TiN_x$ coatings with that of a stoichiometric TiN coating, in which the erosion resistance was assumed to be 1 at both 20° and 90° impact angles. The data obtained is presented in the Table and shows that a maximum erosion resistance at 20° and 90° occurred at about 38 to 40 atomic percent N, which corresponds very well to the region of maximum microhardness.

Based on the elastic-plastic theory, toughness and hardness are the dominant properties controlling erosion behavior. Higher hardness is believed to increase erosion resistance at both low and high impact angles; high toughness reduces the vulnerability to brittle fracture and markedly increases high angle erosion resistance. An erosion resistant coating needs to be simultaneously hard and tough. Previous study showed that the erosion resistance of TiN coating to 50 microns alumina particles increases with decreasing residual compressive stress. Higher residual compressive stress, which generally leads to radial and lateral cracks in the coating during particle impacts, suggests lower toughness. In ZrN coatings, it was found that residual compressive stress of the coating increased linearly with increasing microhardness. A plot of residual compressive stress versus microhardness was plotted in FIG. 1 for the sample coating from the Tables and the data demonstrates that the residual compressive stress of non-stoichiometric $TiN_x$ coatings decreased linearly with increasing microhardness. This implies that non-stoichiometric $TiN_x$ coatings are simultaneously hard and tough.

Figure 2:
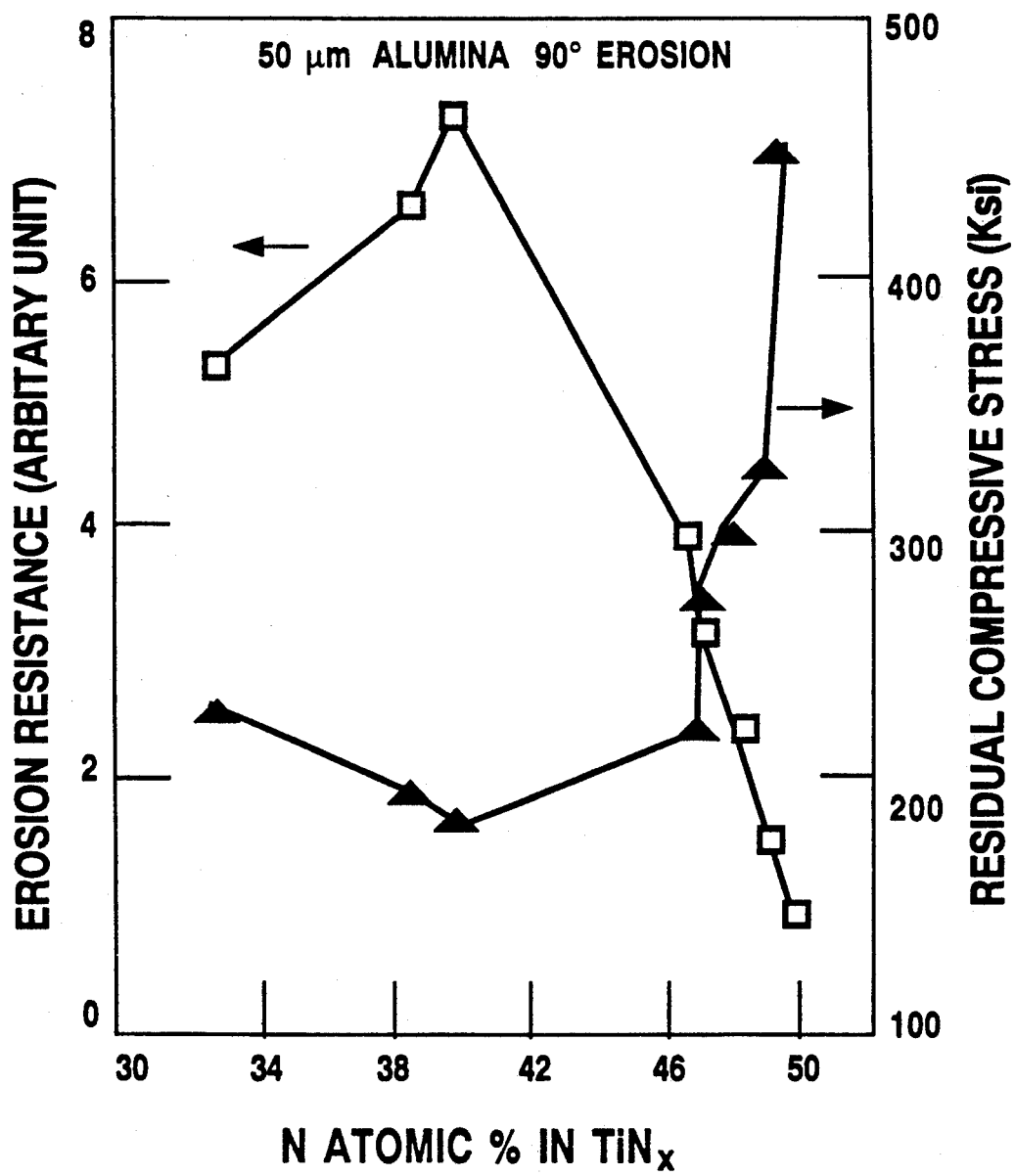
FIG. 2 is a plot of erosion resistance vs. the nitrogen content in $TiN_x$ coatings and a plot of residual compressive stress vs. the nitrogen content in $TiN_x$ coatings.
Figure 3:
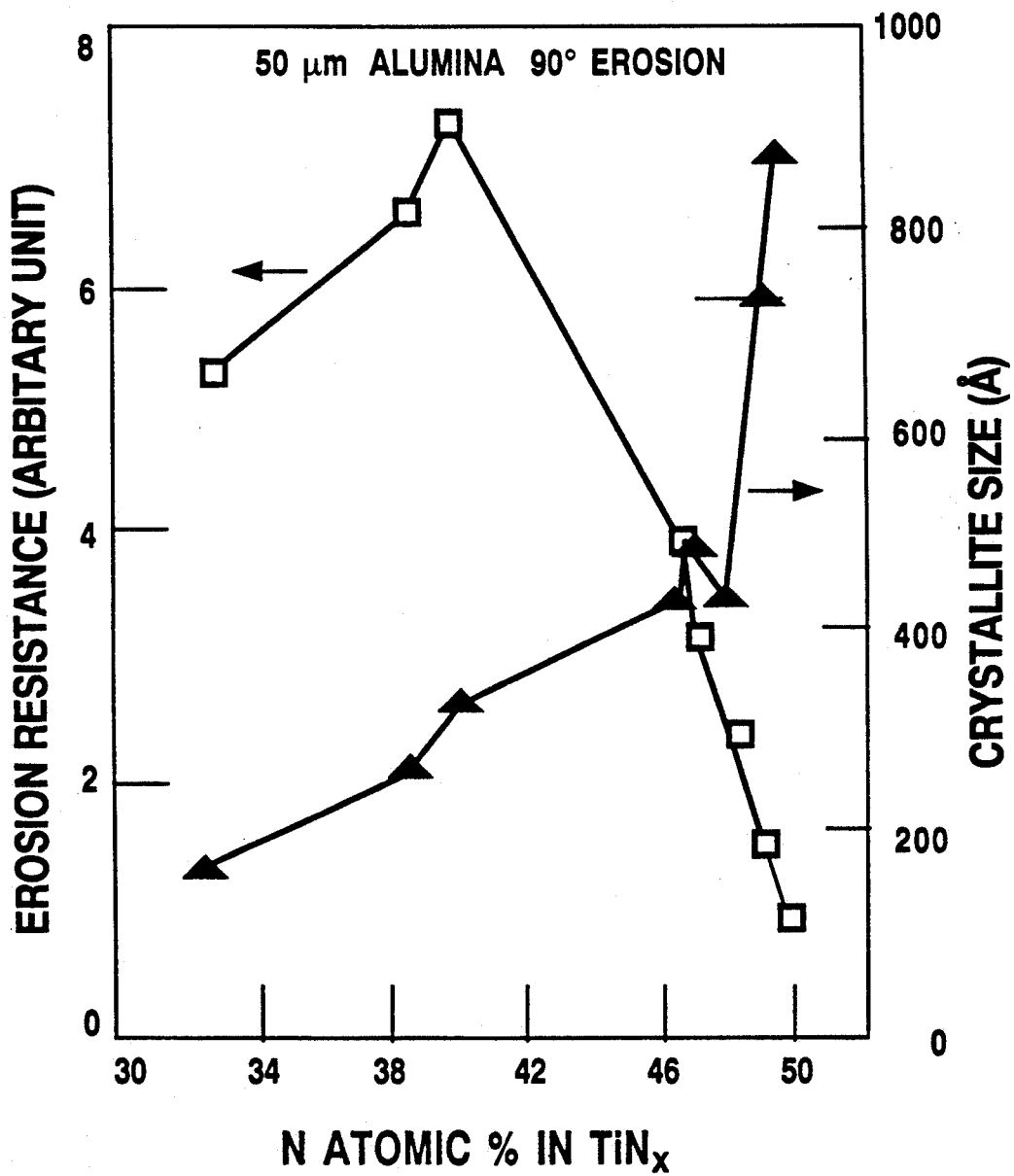
FIG. 3 is a plot of erosion resistance vs. the nitrogen content in $TiN_x$ coatings and a plot of crystallite size vs. the nitrogen content in $TiN_x$ coatings.

FIG. 2 shows a combined plot of erosion resistance vs. N content and compressive stress vs. N content. A trend of increase in 90° erosion resistance with decreasing residual compressive stress was clearly indicated. A marked decrease in residual compressive stress of the coating occurred at about 48 atomic percent N. In FIG. 3 a combined plot of erosion resistance vs. N content and crystallite size vs. N content shows that the erosion resistance of the coating increased with decreasing crystallite size except the coating containing 32.5 atomic percent N. The coatings which contain 32.5 atomic percent N or less are relatively reactive due to high Ti content and susceptible to burning during solid particle impact. Therefore, in spite of small crystallite size in the coating with 32.5 atomic percent N, the higher compressive stress compared with that containing 38 to 40 atomic percent N and the burning of the coating during erosion was probably responsible for a significant reduction in erosion resistance.

Figure 4:
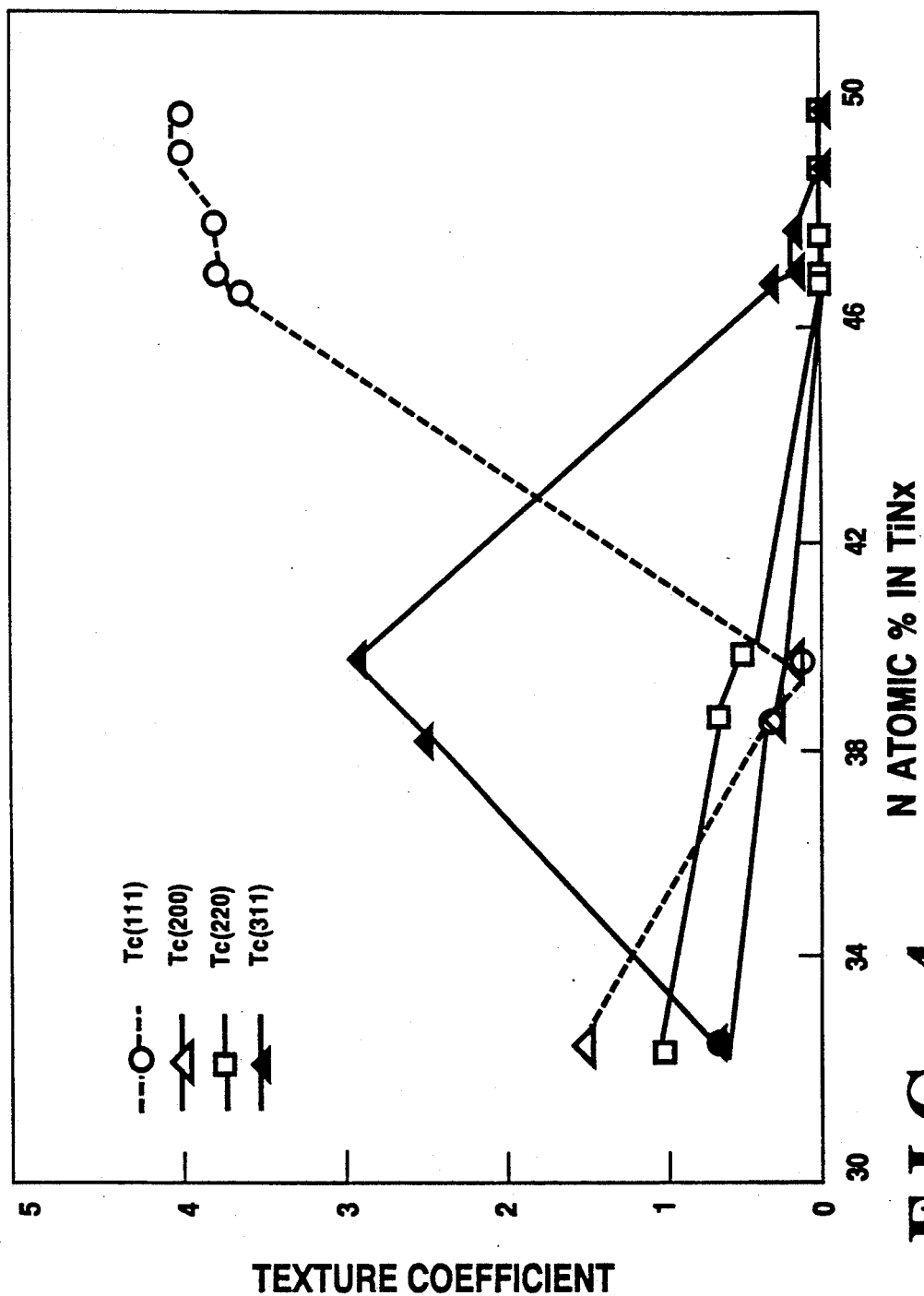
FIG. 4 is a plot of the texture coefficient vs. the nitrogen content in $TiN_x$ coatings.

FIG. 4 shows that the texture coefficient is a function of N concentration in the coating. The coating exhibited a <311> preferred orientation at N content between 35.5 and 41.5 atomic percent, while a <111> preferred orientation appeared at N content greater than 45 atomic percent. A combination of <111> and <311> preferred orientation was obtained at N content between 41.5 and 45 atomic percent; the <311> and <200> preferred orientations occurred between 33.5 and 35.5 atomic percent; and the <200> and <220> preferred orientations occurred at less than 33.5 atomic percent, respectively.

In summary the data from Example 1 shows:

a) The crystallite size decreases with decreasing N content. A transition from large to small crystallite occurs at approximately 47 atomic percent nitrogen.

b) The microhardness of TiN$_x$ coatings increases with decreasing nitrogen content, from 2081 Kgfmm$^{-2}$ at 49.3 atomic percent nitrogen to 2611 Kgfmm$^{-2}$ at 39.9 atomic percent nitrogen, and then decreases to 2286 Kgfmm$^{-2}$ at 32.5 atomic percent nitrogen.

c) The residual compressive stress of the TiN$_x$ coatings decreases with decreasing nitrogen content, from 323 Ksi at 49.3 atomic percent nitrogen to a minimum of 183 Ksi at 39.9 atomic percent nitrogen and then increases to 233 Ksi at 32.5 atomic percent nitrogen.

d) The residual compressive stress of TiN$_x$ coatings decreases linearly with increasing microhardness and the coating containing approximately 40 atomic percent nitrogen exhibits maximum microhardness and minimum residual compressive stress.

e) Erosion resistance of non-stoichiometric TiN$_x$ coatings of this invention to 50 micron alumina particles at both 20° and 90° impact angles is superior to a stoichiometric TiN coating.

f) The non-stoichiometric TiN$_x$ coating of this invention containing approximately 40 atomic percent nitrogen has optimum erosion resistance at both 20° and 90° impact angles.

EXAMPLE 2

Figure 5:
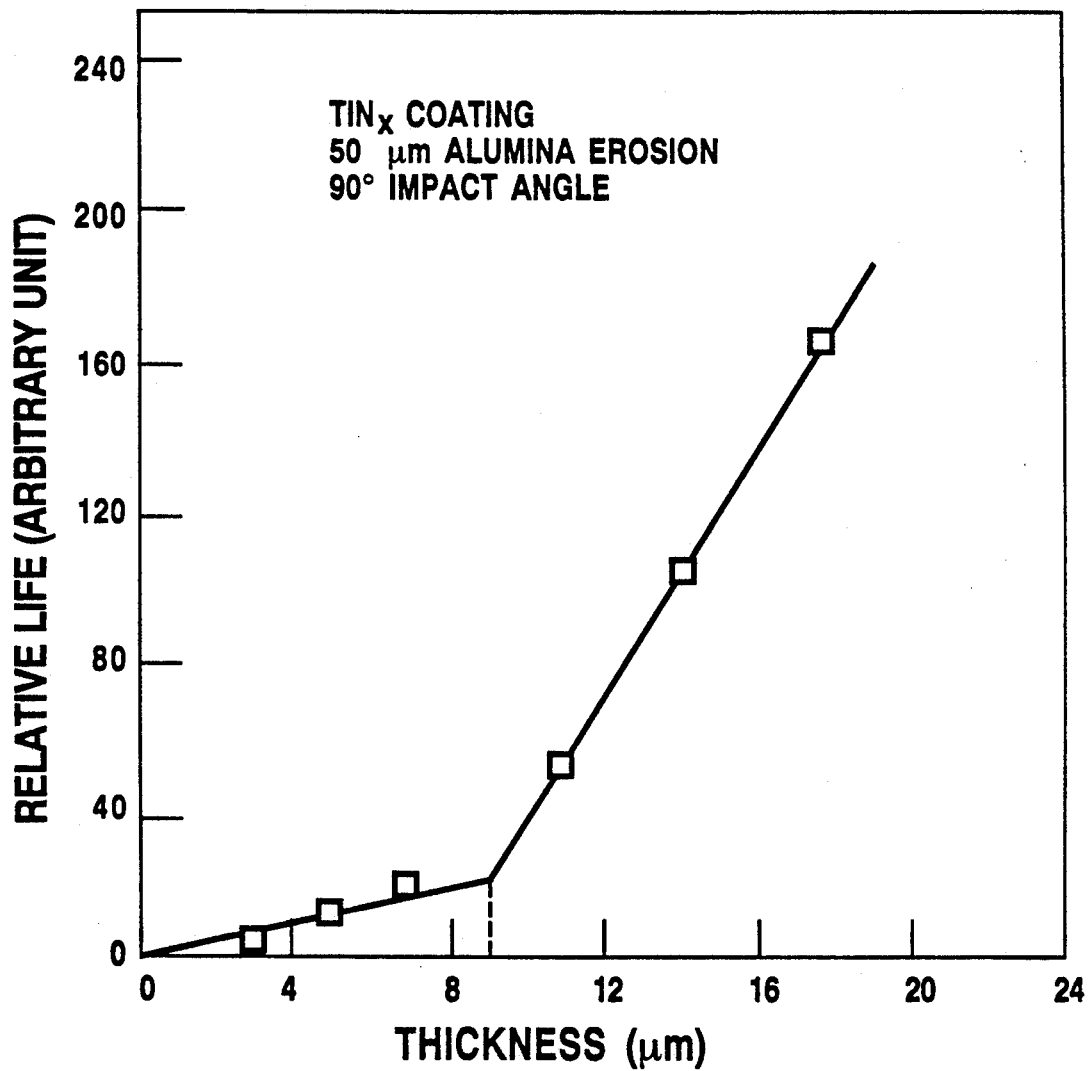
FIG. 5 is a plot of relative life vs. coating thickness for various $TiN_x$ coatings.

TiN$_x$ coatings on titanium coated samples as in Example 1 containing approximately 40 atomic percent nitrogen, with coating thicknesses varying from 3.5 to 17.5 microns, were subjected to 50 microns alumina particles at 90° impact angle to establish the coating life/thickness relationship. The amount of alumina erodent which is needed to penetrate the coating was determined as a function of coating thickness. A 5 to 15 gram increment of alumina erodent was used for each test. Typically, the erosion scar covers a 2.5 cm diameter area. The area of substrate exposure, approximately 1 cm in diameter, was used as a cursory measure for coating penetration. From the data a plot of relative life (arbitrary number) vs. thickness was prepared and is shown in FIG. 5.

Under this test condition, a marked increase in coating life (relative) was observed at coating thicknesses greater than 9 μm. The relative coating life to 50 μm Al$_2$O$_3$ erodent appeared to have a linear relationship with the coating thickness in the thickness range from 9 microns to 17.5 microns.

Although specific embodiments of this invention have been described, it should be understood that various modifications may be made without departing from the spirit of this invention.

What is claimed:

1. A non-stoichiometric titanium nitride coating for substyrates having good wear and corrosion resistance in which the substrate has a non-nitrogen, titanium-containing outer surface and on which a substantially homogeneous titanium nitride coating having a crystallize size, measured in the direction perpendicular to (111) diffraction plane of less than 55 nm, containing from 32.5 to 47 atomic percent nitrogen is disposed over said titanium-containing outer surface exhibiting increased resistance to solid particle impact.

2. The non-stoichiometric titanium nitride coating of claim 1 wherein said titanium nitride contains from 36 to 44 atomic percent nitrogen.

3. The non-stoichiometric titanium nitride coating of claim 1 wherein said titanium nitride contains about 40 atomic percent nitrogen.

4. The non-stoichiometric titanium nitride coating of claim 1 wherein said titanium nitride coating has a microhardness from 2061 to 2695 kilograms force per square millimeter.

5. The non-stoichiometric titanium nitride coating of claim 4 wherein said titanium nitride coating has a residual compressive stress of 175 to 349 kilopounds per square inch.

6. The non-stoichiometric titanium nitride coating of claim 1 wherein said titanium nitride coating is from 1 to 40 microns thick.

7. The non-stoichiometric titanium nitride coating of claim 6 wherein said titanium nitride coating is from 1 to 15 microns thick.

8. The non-stoichiometric titanium nitride coating of claim 6 wherein said titanium nitride coating is from 8 to 40 microns.

9. A coated article having a coating comprising a non-stoichoimetric titanium nitride coating having a crystallize size, measured in the direction perpendicular to (111) diffraction plane of less than 55 nm, having an atomic percent of nitrogen from 32.5% to 47% secured to a substrate selected from the group consisting of titanium, titanium alloy, titanium coated iron or iron alloys, titanium coated aluminum or aluminum alloys, titanium coated nickel or nickel alloys and, titanium coated cobalt or cobalt alloys wherein said coated article exhibits increased resistance to solid particle impact.

10. The coated article of claim 9 wherein the nitrogen content in the titanium nitride coating is from 36 to 44 atomic percent and the substrate is titanium.

11. The coated article of claim 10 wherein the thickness of the titanium nitride coating is from 1 to 40 microns thick.

* * * * *